United States Patent
Gundlach

(10) Patent No.: US 7,436,662 B2
(45) Date of Patent: Oct. 14, 2008

(54) HOT SWAPPABLE COOLING FAN SYSTEM

(75) Inventor: John G. Gundlach, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 11/184,194

(22) Filed: Jul. 19, 2005

(65) Prior Publication Data
US 2007/0019382 A1 Jan. 25, 2007

(51) Int. Cl.
*H05K 7/20* (2006.01)
*F04D 29/60* (2006.01)

(52) U.S. Cl. .......... 361/695; 415/213.1; 454/184

(58) Field of Classification Search .......... 361/695, 361/679, 688, 690, 694; 165/80.3, 104.33; 415/213.1, 214.1; 454/184
See application file for complete search history.

(56) References Cited

U.S. PATENT DOCUMENTS

| | | | |
|---|---|---|---|
| 4,805,868 A | | 2/1989 | Claude |
| 4,834,615 A | * | 5/1989 | Mauch et al. ............ 415/213.1 |
| 5,208,730 A | | 5/1993 | Tracy |
| 5,316,423 A | * | 5/1994 | Kin ............................ 411/510 |
| 5,341,871 A | | 8/1994 | Stelzer |
| 5,788,566 A | * | 8/1998 | McAnally et al. .......... 454/184 |
| 5,793,608 A | * | 8/1998 | Winick et al. .............. 361/695 |
| 6,005,770 A | * | 12/1999 | Schmitt ...................... 361/695 |
| 6,077,037 A | * | 6/2000 | Schmidt .................. 415/213.1 |
| 6,213,819 B1 | * | 4/2001 | Fan ............................ 439/894 |
| 6,236,564 B1 | * | 5/2001 | Fan ............................ 361/695 |
| 6,324,731 B1 | | 12/2001 | Pliml, Jr. |
| 6,351,380 B1 | * | 2/2002 | Curlee et al. .............. 361/695 |
| 6,373,698 B1 | * | 4/2002 | Christensen ............... 361/695 |
| 6,400,568 B1 | * | 6/2002 | Kim et al. .................. 361/697 |

(Continued)

FOREIGN PATENT DOCUMENTS

DE 10116872 A1 * 10/2002

(Continued)

OTHER PUBLICATIONS

Anderson, Fan Vibration Isolator, IBM Technical Disclosure Bulletin, vol. 33, No. 1B, Jun. 1990, pp. 197-198.*

(Continued)

*Primary Examiner*—Jayprakash Gandhi
*Assistant Examiner*—Robert J. Hoffberg
(74) *Attorney, Agent, or Firm*—Martin McKinley, Esq.; Steven M. Greenberg, Esq.; Carey Rodriguez Greenberg & Paul LLP

(57) ABSTRACT

A computer system includes a housing having a base and a door positioned opposite the base and a cooling system. The cooling system includes a support rack that is connected to the base and a first cooling fan that is removably attached to the support rack with a plurality of mounting systems. The mounting systems each include a mount that extends away from the cooling fan in a direction substantially parallel to a rotational axis of the cooling fan and/or the mount extends in a direction substantially parallel to an area, proximate the first cooling fan, of the door. The support rack is configured to position the first cooling fan away from the housing.

16 Claims, 3 Drawing Sheets

U.S. PATENT DOCUMENTS

| | | | |
|---|---|---|---|
| 6,414,845 B2 * | 7/2002 | Bonet | 361/695 |
| 6,462,948 B1 * | 10/2002 | Leija et al. | 361/697 |
| 6,493,225 B2 * | 12/2002 | Chuang et al. | 361/695 |
| 6,504,718 B2 * | 1/2003 | Wu | 361/695 |
| 6,556,437 B1 * | 4/2003 | Hardin | 361/687 |
| 6,592,327 B2 * | 7/2003 | Chen et al. | 415/213.1 |
| 6,603,661 B2 * | 8/2003 | Smith et al. | 361/695 |
| 6,616,525 B1 * | 9/2003 | Giraldo et al. | 454/184 |
| 6,648,590 B2 * | 11/2003 | Huang et al. | 415/53.1 |
| 6,795,314 B1 * | 9/2004 | Arbogast et al. | 361/695 |
| 6,817,939 B2 * | 11/2004 | Gan et al. | 454/184 |
| 6,851,925 B2 * | 2/2005 | Chuang | 415/126 |
| 6,894,897 B1 * | 5/2005 | Nagurny et al. | 361/695 |
| 6,951,446 B2 * | 10/2005 | Hung | 415/213.1 |
| 7,002,796 B2 * | 2/2006 | Lao et al. | 361/695 |
| 7,170,744 B2 * | 1/2007 | Li | 361/687 |
| 7,209,352 B2 * | 4/2007 | Chen | 361/695 |
| 2003/0026074 A1 * | 2/2003 | Clements et al. | 361/695 |
| 2003/0095866 A1 * | 5/2003 | Chuang | 415/176 |
| 2004/0010351 A1 * | 1/2004 | Mohiuddin et al. | 700/300 |
| 2004/0057216 A1 * | 3/2004 | Smith et al. | 361/724 |
| 2004/0256334 A1 * | 12/2004 | Chen | 211/41.17 |
| 2004/0264145 A1 * | 12/2004 | Miller et al. | 361/725 |
| 2005/0002777 A1 * | 1/2005 | Chuang | 415/127 |
| 2006/0152901 A1 * | 7/2006 | Espinoza-Ibarra et al. | 361/695 |
| 2007/0008699 A1 * | 1/2007 | Strmiska et al. | 361/687 |

FOREIGN PATENT DOCUMENTS

| | | | |
|---|---|---|---|
| JP | 02286900 A | * | 11/1990 |
| JP | 200186575 A | | 7/2000 |

OTHER PUBLICATIONS

Single replaceable RAID system, Research Disclosure, Sep. 2001.

* cited by examiner

HOT SWAPPABLE COOLING FAN SYSTEM

BACKGROUND OF THE INVENTION

1. Field of the Invention

The disclosure relates generally to computer systems and, more specifically, to computer systems having hot swappable cooling fan systems.

2. Description of the Related Art

Many computer systems include components that, although important in keeping the computer system running, are not absolutely necessary for the short-term operation of the computer system. For example, where multiple hard drives or power supplies are included within the computer system, a hard drive or power supply can be temporarily removed without completely disrupting the operation of the computer system. To maximize uptime of computer systems, many components, such as hard drives and power supplies are hot swappable, which allow for the removal and replacement of these components while the computer system is still operating.

Another type of component that may be temporarily removed without completely disrupting the operation of the computer system is a cooling fan system. The cooling fan system may include the fan itself, fan shroud, fan ducts and/or any other related subassembly. There is, therefore, a need for a hot swappable cooling fan system for computer systems. There are, however, certain issues with cooling fan systems that interfere with the ability of the cooling fan system to be hot swappable. For example, a cooling fan produces vibration that may interfere with other components in the computer system. Thus, there is a need for vibration isolation upon mounting the cooling fan within the computer system.

An additional issue associated with implementing hot swappable cooling fan systems is that the size of the cooling fan is limited by the housing in which the computer system is located. A larger cooling fan produces more cooling, and thus, there is a desire to place as large a cooling fan as possible into a particular dimensioned location. However, the desire for vibration isolation interferes with the desire to maximize the size of the cooling fan in a particular location. There is, therefore, a need for a cooling fan system that is hot swappable, provides vibration isolation, and allows for the size of the cooling fan to be maximized for a particular location.

BRIEF SUMMARY OF THE INVENTION

Embodiments of the invention address deficiencies of the art in respect to computer systems and provide a novel system for cooling components within a computer system. In this regard, the computer system includes a cooling fan system and a housing having a base and a door positioned opposite the base. The cooling system includes a support rack that is connected to the base and a first cooling fan that is removably attached to the support rack with a plurality of mounting systems. The mounting systems each include a mount that is connected to and extends away from the cooling fan in a direction substantially parallel to a rotational axis of the cooling fan and/or the mount extends in a direction substantially parallel to an area, proximate the first cooling fan, of the door. The support rack is configured to position the first cooling fan away from the housing.

Each of the plurality of mounting systems includes a mounting slot within the support rack, and the mounting slot is adapted to receive the mount. An opening of the mounting slot is positioned proximate the door. Additionally, a second cooling fan may be included adjacent the first cooling fan, and the mounts of the plurality of mounting systems of the first cooling fan extend in a direction substantially parallel to an area defined by the second cooling fan and proximate the first cooling fan. A cable slot is included in the support rack and is positioned substantially in a middle position of the adjacent cooling fans. The support rack has an inner dimension greater than an outer dimension of the first cooling fan along a direction of movement of the cooling fan towards the door.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
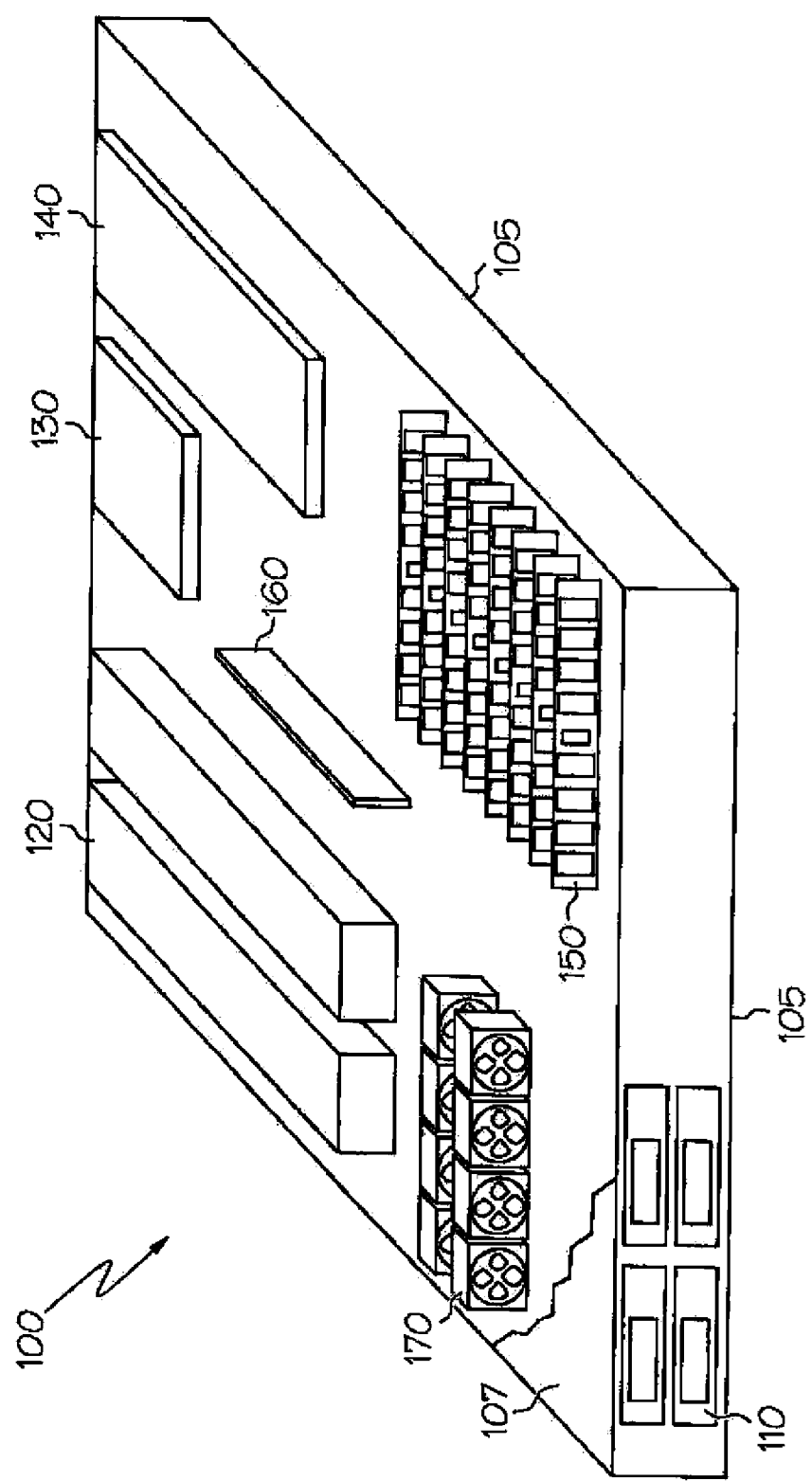
FIG. 1 is a perspective schematic illustration of a computer system.

FIG. 1 illustrates a computer system 100 and housing 105 that employ a cooling fan system 170. Although not limited in this manner, the computer system 100 may include such devices as hard drives 110, power supplies 120, PCI slots 130, PCI express slot 140, and memory cards 150. In certain aspects of the computer system, certain of the devices within the computer system 100 may be hot swappable, for example, the hard drives 110, power supplies 120, and cooling fan system 170. Hot swapping of certain devices, which may fail and/or require maintenance, allows for maximizing uptime of the computer system 100.

A cooling fan 174 (illustrated in FIG. 3) of the cooling fan system 170 may be sized to minimize clearance between the cooling fan 174 and opposite walls of the housing 105 in which the cooling fan 174 is positioned. For example, for a housing 105 of the computer system 100 that has a vertical inside dimension of 41 mm, the cooling fan 174 may have at least one outside dimension of 40 mm. By minimizing a clearance between two opposing walls of the housing 105 and the cooling fan 174, leakage of fluid past the cooling fan 174 can be reduced and the efficiency of the cooling fan 174 is increased. As used herein, the term cooling fan 174 may refer to an assembly that includes one or more separate fans, and these fans may or may not be along a common axis.

Figure 3:
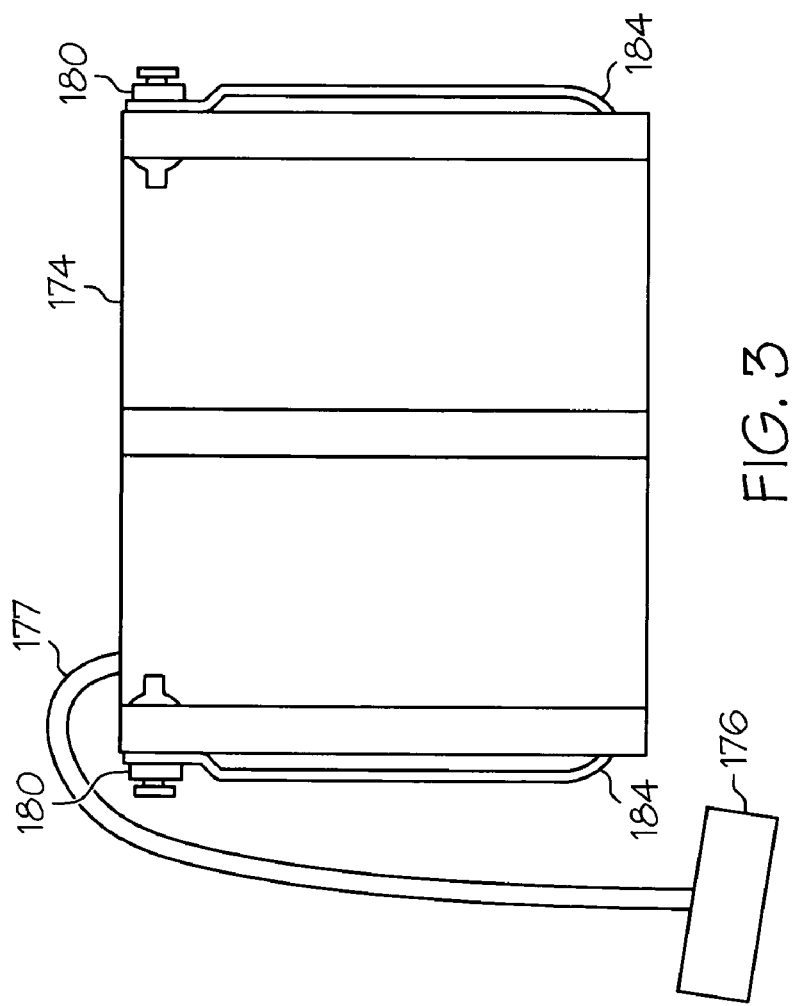
FIG. 3 is a side view of a cooling fan in accordance with the inventive arrangements.
Figure 2:
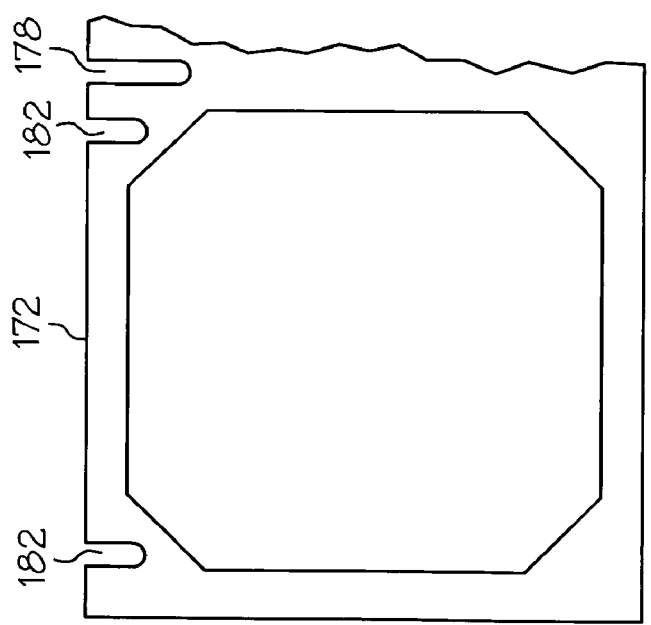
FIG. 2 is a front view of a support rack for a cooling fan in accordance with the inventive arrangements.

FIGS. 2 and 3 respectively illustrate a support rack 172 and cooling fan 174 of the cooling fan system 170. The cooling fan system 170 includes mounting systems for connecting the cooling fan 174 to the support rack 172. In a present aspect of the cooling fan system 170 the mounting system is a mount 180 that is attached to the cooling fan 174 and is adapted to be received by mounting slots 182 within the support rack 174, although the cooling fan system 170 is not limited in this manner. For example, the mounting system may include a mount in the support rack 172 and the cooling fan 174 is adapted to receive the mount.

The mounts 180 are not limited as to a particular type of mount. However, in certain aspects of the cooling fan assembly 170 the mounts 180 and a feature that receives the mounts 180 are configured to isolate and/or dampen vibration from the cooling fan 174 to the support rack 172. In a present aspect of the cooling fan system 170, the mounts 180 are constructed from a vibration isolation material, such as rubber, foam, and Isodamp, a registered trademark of EAR Specialty Composites. Another example of a configuration for vibration isolation is to have the mounting slots 182 within the support rack 174 being coated with a vibration isolation material or to have the mounting slots 182 include an insert (not shown) formed from a vibration isolation material. As can be readily appreciated, many systems that have vibration isolation characteristics can be employed to mount the cooling fan 174 to the support rack 172.

The cooling fan 174 may also include a connector 176 for connecting the cooling fan 174 to, for example, a power supply (not shown) and/or a controller (not shown). Although not limited in this manner, the support rack 172 may include a cable slot 178 that is adapted to receive a cable 177 of the connector 176.

The cooling fan 174 may also include a grill 184 that is located at the inlet and/or outlet ends of the cooling fan 174. A grill 184 may be employed to prevent large objects from entering/exiting the cooling fan 174. Although not limited in this manner, the grill 184 may be connected to the cooling fan 174, at least in part, via the mounts 180. Additionally, the grill 184 may be included in the support rack 172, for example, attached to the support rack 172 or molded in a single piece with the support rack 172.

Figure 5:
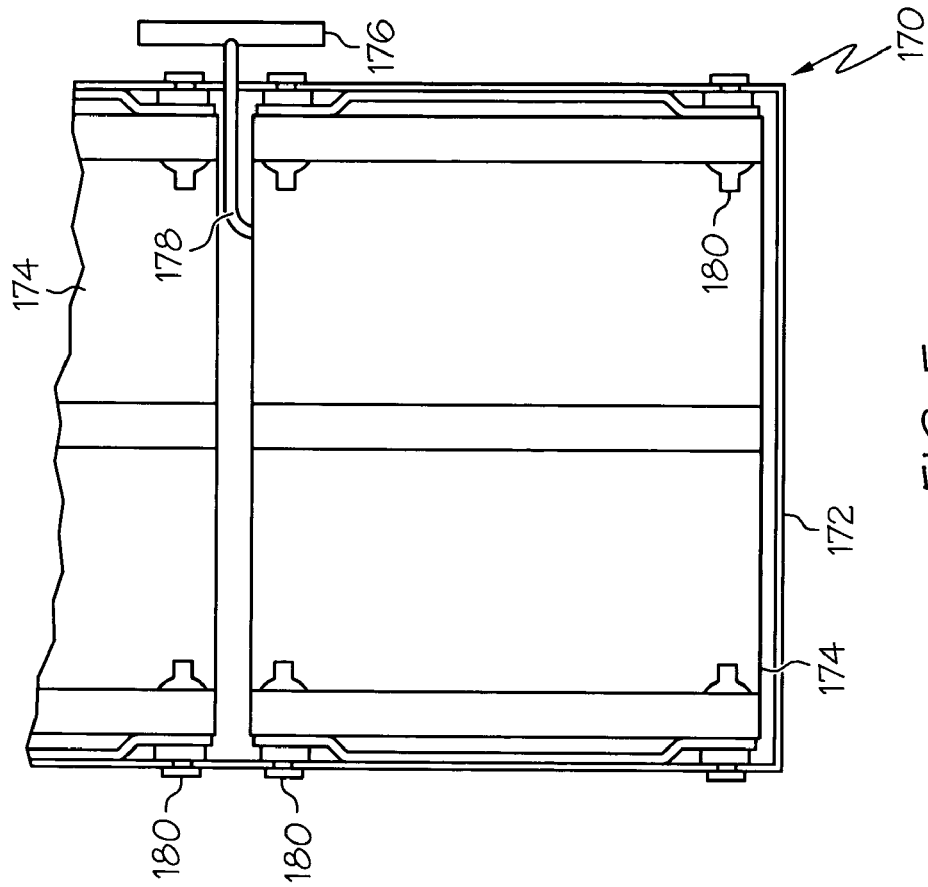
FIG. 5 is a top view of two cooling fans within the support rack.
Figure 4:
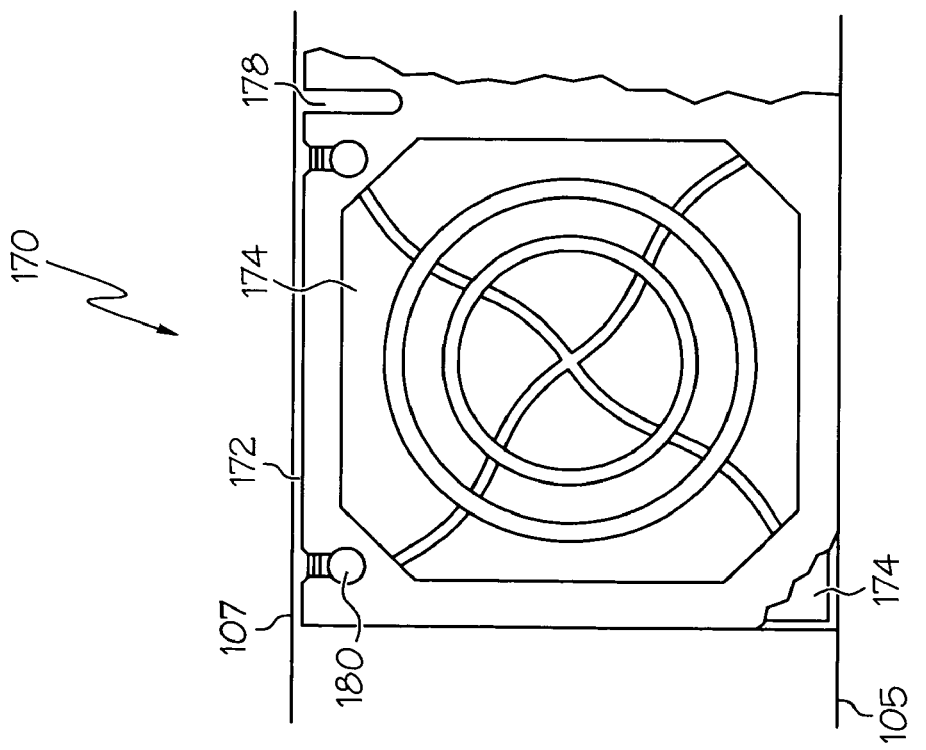
FIG. 4 is a front view of the cooling fan positioned within the support rack that is attached to a housing of the computer system.

FIG. 4 illustrates the cooling fan 174 positioned within the support rack 172, and FIG. 5 illustrates multiple cooling fans 174 positioned with the support rack 172. In the same manner that at least one dimension of the cooling fan 174 is sized to minimize clearance between the cooling fan 174 and opposite walls of the housing 105, by reducing a distance between adjacent cooling fans 174 (best shown in FIG. 5), leakage of fluid past the cooling fans 174 can be reduced and efficiency of the cooling fans 174 are increased.

In certain aspects of the support rack 172, the cable slot 178 is positioned at a position substantially in the middle of two adjacent cooling fans 174. Since, in certain aspects of the cooling fan system 170, clearance between adjacent cooling fans 174 and the cooling fans 174 and the housing 105 is minimized, where the cable slot 178 is positioned may affect these clearances. By positioning the cable slot 178 substantially in the middle of two adjacent cooling fans 174, the space, and thus clearance, utilized by the cable slot 178 is shared by rack space for two cooling fans 174. In this manner, the effective space utilized by the cable slot 178 may be halved.

As illustrated in FIG. 4, the support rack 172 is connected to a base of the housing 105. In a current aspect of the cooling fan system 170, a door 107, of the housing 105, is located opposite of the base of the housing 105, and the door 107 enables access to the cooling fan 174. The door 107 is not limited in the manner in which the door 107 provides access to the cooling fan 174. For example, the door 107 may be hinged to the housing 105 or slide relative to the housing 105.

In this manner, the cooling fan 174 can be removed from the support rack 172 and replaced while the computer system 100 is still operating. The cooling fan 174 is hung from the support rack 172 such that clearance exists between the cooling fan 174 and the base of the housing 105. For example, both mounting slots 182, into which the mounts 180 are positioned, and the cable slot 178 may be positioned proximate the door 107 of the housing 105. In this manner, the cooling fan 174 and the cable 177 (illustrated in FIG. 3) are easily removed in a direction towards the door 107.

Additionally, as best shown in FIG. 5, which is a view of the support rack 172 and cooling fan 174 from the door 107 towards the support rack 172, the support rack 172 may be open and clear of any obstruction that would prevent or hamper the cooling fan 174 from being removed from or placed into the support rack 172. For example, the support rack 172 may have an inner dimension greater than an outer dimension of the cooling fan 174 along a direction of movement of the cooling fan 174 towards the door 107 of the housing 105. In this manner, upon a user opening the door 107 of the housing 105, the user can easily remove the cooling fan 174 from the support rack 172 and replace the cooling fan 174.

In a current aspect of the cooling fan system 170, upon being positioned within the support rack 172, the cooling fan 174 hangs from the support rack 172 via the mounts 180 without contacting either side (e.g., the base or the door 107) of the housing 105. In this manner, clearance between the cooling fan 174 and both sides of the housing 105 can be minimized, and vibration caused by the cooling fan 174 can be isolated from the computer system 100 via the mounts 180.

Clearance between two opposing walls of the housing 105 and the cooling fan 174 and clearance between adjacent cooling fans 174 may also be reduced by having the mounts 180 be positioned in a direction substantially parallel to areas proximate the cooling fan 174 in which minimal clearance is desired, for example, the two opposing walls of the housing 105 and an adjacent cooling fan 174, respectively. For example, in a present aspect of the cooling fan system 170, the mounts 180 are positioned away from the cooling fans 174 in a direction parallel to the flow of fluid through the cooling fans 174 and/or the rotational axis of the cooling fans 174.

What is claimed is:

1. A cooling fan system for a computer system, comprising
   a first cooling fan;
   a support rack; and
   a plurality of mounting systems for removably attaching the first cooling fan to the support rack, wherein the support rack is configured to position the first cooling fan away from a housing of the computer system, wherein
   each of the plurality of mounting systems includes a mount extending from the first cooling fan and a mounting slot within the support rack, and the mounting slot is adapted to receive the mount, and
   an opening of the mounting slot is positioned on an outside periphery of the support rack.

2. The cooling fan system according to claim 1, wherein the mount extends away from the first cooling fan in a direction substantially parallel to a rotational axis of the cooling fan.

3. The cooling fan system according to claim 1, further comprising:
   a second cooling fan adjacent the first cooling fan, and cable slot positioned within the support rack substantially in a middle position of the adjacent cooling fans.

4. The cooling fan system according to claim 1, wherein the support rack has an inner dimension greater than an outer dimension of the first cooling fan along a direction of movement of the cooling fan towards the opening of the mounting slot.

5. A computer system, comprising:
a housing having a base and a door positioned opposite the base;
a support rack connected to the base;
a first cooling fan; and
a plurality of mounting systems for removably attaching the first cooling fan to the support rack, wherein
the plurality of mounting systems each include a mount extending in a direction substantially parallel to a plane defined by an area, proximate the first cooling fan, of the door, wherein
each of the plurality of mounting systems includes a mounting slot within the support rack, and the mounting slot is adapted to receive the mount, and
an opening of the mounting slot is positioned on an outside periphery of the support rack.

6. The cooling fan system according to claim 5, wherein the opening of the mounting slot is positioned proximate the door.

7. The cooling fan system according to claim 5, further comprising:
a second cooling fan adjacent the first cooling fan, and
the mounts of the plurality of mounting systems of the first cooling fan extending in a direction substantially parallel to an area defined by the second cooling fan and proximate the first cooling fan.

8. The cooling fan system according to claim 7, further comprising:
a cable slot positioned within the support rack substantially in a middle position of the adjacent cooling fans.

9. The cooling fan system according to claim 5, wherein the first cooling fan positioned away from the housing.

10. The cooling fan system according to claim 5, wherein the support rack has an inner dimension greater than an outer dimension of the first cooling fan along a direction of movement of the cooling fan towards the door.

11. A computer system, comprising:
a housing having a base and a door positioned opposite the base;
a support rack connected to the base;
a first cooling fan; and
a plurality of mounting systems for removably attaching the first cooling fan to the support rack, wherein
the plurality of mounting systems each include a mount extending away from the cooling fan in a direction substantially parallel to a rotational axis of the cooling fan, wherein
each of the plurality of mounting systems includes a mounting slot within the support rack, and the mounting slot is adapted to receive the mount, and
an opening of the mounting slot is positioned on an outside periphery of the support rack.

12. The cooling fan system according to claim 11, wherein each of the plurality of mounting systems includes a mounting slot within the support rack, and the mounting slot is adapted to receive the mount.

13. The cooling fan system according to claim 11, wherein the opening of the mounting slot is positioned proximate the door.

14. The cooling fan system according to claim 11, wherein the support rack has an inner dimension greater than an outer dimension of the first cooling fan along a direction of movement of the cooling fan towards the door.

15. The cooling fan system according to claim 11, further comprising:
a second cooling fan adjacent the first cooling fan, and
a cable slot positioned within the support rack substantially in a middle position of the adjacent cooling fans.

16. The cooling fan system according to claim 11, wherein the first cooling fan positioned away from the housing.

* * * * *